(12) United States Patent
Zhang et al.

(10) Patent No.: US 12,550,251 B2
(45) Date of Patent: Feb. 10, 2026

(54) PRINTED CIRCUIT BOARD AND SIGNAL TRANSMISSION SYSTEM

(71) Applicant: ZTE Corporation, Shenzhen (CN)

(72) Inventors: Xindan Zhang, Shenzhen (CN); Zhongmin Wei, Shenzhen (CN); Bi Yi, Shenzhen (CN); Yonghui Ren, Shenzhen (CN); Yu Bi, Shenzhen (CN)

(73) Assignee: ZTE CORPORATION, Shenzhen (CN)

( * ) Notice: Subject to any disclaimer, the term of this patent is extended or adjusted under 35 U.S.C. 154(b) by 218 days.

(21) Appl. No.: 18/695,079

(22) PCT Filed: Mar. 14, 2022

(86) PCT No.: PCT/CN2022/080794
§ 371 (c)(1),
(2) Date: Mar. 25, 2024

(87) PCT Pub. No.: WO2023/045276
PCT Pub. Date: Mar. 30, 2023

(65) Prior Publication Data
US 2024/0397612 A1    Nov. 28, 2024

(30) Foreign Application Priority Data
Sep. 23, 2021    (CN) .......................... 202111110049.9

(51) Int. Cl.
*H05K 1/02*    (2006.01)
*H05K 1/11*    (2006.01)

(52) U.S. Cl.
CPC ......... *H05K 1/0245* (2013.01); *H05K 1/0284* (2013.01); *H05K 1/115* (2013.01)

(58) Field of Classification Search
CPC ..... H05K 1/0245; H05K 1/0284; H05K 1/115
(Continued)

(56) References Cited

U.S. PATENT DOCUMENTS

2009/0188711 A1    7/2009    Ahmad
2010/0252313 A1*  10/2010    Tsujino ................. H01L 23/057
                                                        174/262

(Continued)

FOREIGN PATENT DOCUMENTS

CN    203015284 U    6/2013
CN    103260338 A    8/2013
(Continued)

OTHER PUBLICATIONS

European Search Report for corresponding application EP22871341; Mail date Apr. 4, 2025.
(Continued)

*Primary Examiner* — Andargie M Aychillhum
(74) *Attorney, Agent, or Firm* — CANTOR COLBURN LLP (57) ABSTRACT

Embodiments of the present disclosure relate to the technical field of signal transmission, and in particular to a printed circuit board and a signal transmission system. In the printed circuit board, a first signal line (140) extends, by means of passing through a second hole segment (135) and a fourth hole segment (137), from one first differential signal hole pair (121) of a first column structural unit (120) to the side of a second column structural unit (130) that is away from the first column structural unit; or, a first signal line (340) extends, by means of passing through two adjacent second ground holes (332), from one first differential signal hole pair (321) of a first column structural unit (320) to the side of a second column structural unit (330) that is away from the first column structural unit (320).

20 Claims, 4 Drawing Sheets

(58) Field of Classification Search
USPC .......................................................... 174/266
See application file for complete search history.

(56) References Cited

U.S. PATENT DOCUMENTS

| | | | |
|---|---|---|---|
| 2011/0232955 A1* | 9/2011 | Morgan ................. | H05K 1/115 |
| | | | 174/266 |
| 2017/0265296 A1 | 9/2017 | Charbonneau et al. | |
| 2017/0331250 A1 | 11/2017 | Kagaya et al. | |
| 2018/0049312 A1 | 2/2018 | Gailus et al. | |

FOREIGN PATENT DOCUMENTS

| | | | |
|---|---|---|---|
| CN | 103687292 | A | 3/2014 |
| CN | 104969669 | A | 10/2015 |
| CN | 107548226 | A | 1/2018 |
| CN | 207166845 | U | 3/2018 |
| CN | 208754588 | U | 4/2019 |
| CN | 109842990 | A | 6/2019 |
| CN | 113163624 | A | 7/2021 |
| CN | 113573472 | A | 10/2021 |
| JP | 2004241680 | A | 8/2004 |
| JP | 2007258358 | A | 10/2007 |
| WO | 2005081595 | A2 | 9/2005 |

OTHER PUBLICATIONS

High-Speed Printed Circuit Board Design, China Science and Technology Information Nov. 2013.
International Search Report for corresponding application PCT/CN2022/080794 filed Mar. 14, 2022; mail date May 24, 2022.

* cited by examiner

Fig. 10

PRINTED CIRCUIT BOARD AND SIGNAL TRANSMISSION SYSTEM

CROSS-REFERENCE TO RELATED APPLICATION

The present disclosure is a national stage filing under 35 U.S.C. § 371 of international application number PCT/CN2022/080794, filed Mar. 14, 2022, which claims the priority of Chinese Patent Application 202111110049.9, filed in on Sep. 23, 2021, and the entire contents of which are herein incorporated by reference.

TECHNICAL FIELD

Embodiments of the present disclosure relate to the technical field of signal transmission, and in particular to a printed circuit board and a signal transmission system.

BACKGROUND

With the development of science and technology, ultra-high-speed high-capacity transmission systems have also made significant progresses, wherein high-speed connectors, serving as one of the most important signal transmission devices of the ultra-high-speed high-capacity transmission systems, are widely applied to electronic devices and are located at key connection positions of the electronic devices.

Figure 1:
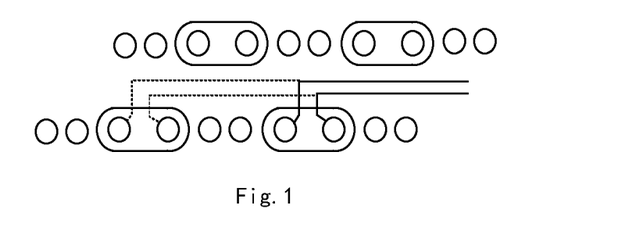
FIG. 1 is a schematic structural diagram in which a packaging structure of a printed circuit board is located on an outgoing line layer.

Generally, the high-speed connector is mutually matched and connected with a packaging structure of a printed circuit board through a fish-eye structure at the tail end of a pin. As shown in FIG. 1, the packaging structure of the printed circuit board is composed of a plurality of column structural units that are located on a printed circuit board body, each column structural unit includes a plurality of via holes, which are sequentially formed in a first direction, the plurality of via holes are composed of a plurality of differential signal hole pairs and a plurality of ground holes, the plurality of column structural units are sequentially disposed in a second direction, and the first direction intersects with the second direction, wherein the wiring mode of the packaging structure of the printed circuit board is that a signal line located on an outgoing line layer is connected with the differential signal hole pairs in a certain column structural unit, and then extend outs from a gap between the column structural unit and a column structural unit connected thereto, such that the wiring mode is relatively single, accordingly only one signal line of each column structural unit may extend out from the same outgoing line layer, and thus the number of outgoing line layers needs to be increased to connect the plurality of differential signal hole pairs in the column structural unit with signal lines; and since the number of the outgoing line layers is increased, the number of layers of the printed circuit board body is absolutely increased, so that the manufacturing cost of the printed circuit board is relatively high.

Therefore, there is an urgent need to provide a printed circuit board and a signal transmission system, so as to reduce the number of layers of a printed circuit board body on the premise of ensuring that a plurality of differential signal hole pairs in a column structural unit may be connected with signal lines, and thus reducing the manufacturing cost of the printed circuit board.

SUMMARY

An embodiment of the present disclosure provides a printed circuit board, including: a board body, a first column structural unit, a second column structural unit and a first signal line; the board body is provided with a first board block and a second board block in sequence in the thickness direction thereof, and the second board block is provided with a first outgoing line layer; the first column structural unit includes a plurality of first differential signal hole pairs and a plurality of first ground holes, the plurality of first differential signal hole pairs are sequentially disposed in a first direction, and at least one first ground hole is formed between two adjacent first differential signal hole pairs, wherein each first differential signal hole pair and each first ground hole both penetrate through the first board block and the second board block, the first column structural unit and the second column structural unit are sequentially disposed in a second direction, and the first direction intersects with the second direction; the second column structural unit includes a plurality of via holes, the plurality of via holes are sequentially formed in the first direction, the plurality of via holes include a first via hole and a second via hole adjacent to the first via hole, wherein the first via hole and the second via hole both penetrate through the first board block and the second board block, the first via hole includes a first hole segment and a second hole segment, the second via hole includes a third hole segment and a fourth hole segment, the first hole segment and the third hole segment are located in the first board block, the distance between the first hole segment and the third hole segment is a first distance, the second hole segment and the fourth hole segment are located in the second board block, the distance between the second hole segment and the fourth hole segment is a second distance, and the first distance is less than the second distance; and the first signal line is located on the first outgoing line layer, and the first signal line extends, by means of passing through the second hole segment and the fourth hole segment, from one first differential signal hole pair of the first column structural unit to the side of the second column structural unit that is away from the first column structural unit.

An embodiment of the present disclosure further provides a printed circuit board, including: a board body, a first column structural unit, a second column structural unit and a first signal line; the board body is provided with a first board block and a second board block in sequence in the thickness direction thereof, and the second board block is provided with a first outgoing line layer; the first column structural unit includes a plurality of first differential signal hole pairs and a plurality of first ground holes, the plurality of first differential signal hole pairs are sequentially disposed in a first direction, and at least one first ground hole is formed between two adjacent first differential signal hole pairs, wherein each first differential signal hole pair and each first ground hole both penetrate through the first board block and the second board block, the first column structural unit and the second column structural unit are sequentially disposed in a second direction, and the first direction intersects with the second direction; the second column structural unit includes a plurality of second differential signal hole pairs and a plurality of second ground holes, the plurality of second differential signal hole pairs are sequentially disposed in the first direction, and two adjacent second ground holes are formed between two adjacent second differential signal hole pairs, wherein each second differential signal hole pair and each second ground hole both penetrate through the first board block and the second board block; and the first signal line is located on the first outgoing line layer, and the first signal line extends, by means of passing through the two adjacent second ground holes, from one first differential signal hole pair of the first column structural unit to the side of the second column structural unit that is away from the first column structural unit.

An embodiment of the present disclosure further provides a signal transmission system, including: the printed circuit board described above.

BRIEF DESCRIPTION OF THE DRAWINGS

To illustrate technical solutions in the embodiments of the present disclosure more clearly, a brief introduction on the drawings which are needed in the description of the embodiments is given below. Apparently, the drawings in the description below are merely some of the embodiments of the present disclosure, based on which other drawings may be obtained by those ordinary skilled in the art without any creative effort.

DETAILED DESCRIPTION OF THE EMBODIMENTS

The main purpose of the embodiments of the present disclosure is to provide a printed circuit board and a signal transmission system, so as to reduce the number of layers of a printed circuit board body on the premise of ensuring that a plurality of differential signal hole pairs in a column structural unit can be connected with signal lines, and thus reducing the manufacturing cost of the printed circuit board.

Those ordinary skilled in the art can understand that, in various embodiments of the present disclosure, many technical details are set forth to enable readers to better understand the present disclosure. However, the technical solutions claimed in the present disclosure may be implemented even without these technical details and various changes and modifications based on the following embodiments. The division of the following embodiments is for the convenience of description, and should not constitute any limitation on the specific implementations of the present disclosure, and various embodiments may be mutually combined and mutually referenced on the premise of no contradiction.

Some embodiments of the present disclosure provide a printed circuit board, a board body is provided with a first board block and a second board block in sequence in the thickness direction thereof, and the second board block is provided with a first outgoing line layer; a first column structural unit includes a plurality of first differential signal hole pairs and a plurality of first ground holes, the plurality of first differential signal hole pairs are sequentially disposed in a first direction, and at least one first ground hole is formed between two adjacent first differential signal hole pairs, wherein each first differential signal hole pair and each first ground hole both penetrate through the first board block and the second board block, the first column structural unit and a second column structural unit are sequentially disposed in a second direction, and the first direction intersects with the second direction; the second column structural unit includes a plurality of via holes, the plurality of via holes are sequentially formed in the first direction, the plurality of via holes include a first via hole and a second via hole adjacent to the first via hole, wherein the first via hole and the second via hole both penetrate through the first board block and the second board block, the first via hole includes a first hole segment and a second hole segment, the second via hole includes a third hole segment and a fourth hole segment, the first hole segment and the third hole segment are located in the first board block, the distance between the first hole segment and the third hole segment is a first distance, the second hole segment and the fourth hole segment are located in the second board block, the distance between the second hole segment and the fourth hole segment is a second distance, and the first distance is less than the second distance; and a first signal line is located on the first outgoing line layer, and the first signal line extends, by means of passing through the second hole segment and the fourth hole segment, from one first differential signal hole pair of the first column structural unit to the side of the second column structural unit that is away from the first column structural unit. Therefore, the signal line has more wiring modes, such that the number of signal lines capable of passing through each outgoing line layer can be increased, and there is no need to increase the number of signal lines by means of increasing the number of layers of the printed circuit board body, in this way, the number of layers of the printed circuit board body can be reduced on the premise of ensuring that the plurality of differential signal hole pairs in the first column structural unit can be connected with the signal lines, and thus reducing the manufacturing cost of the printed circuit board.

In order to make the objectives, technical solutions and advantages of some embodiments of the present disclosure clearer, a printed circuit board provided in some embodiments of the present disclosure will be described in detail below in combination with the drawings.

Figure 2:
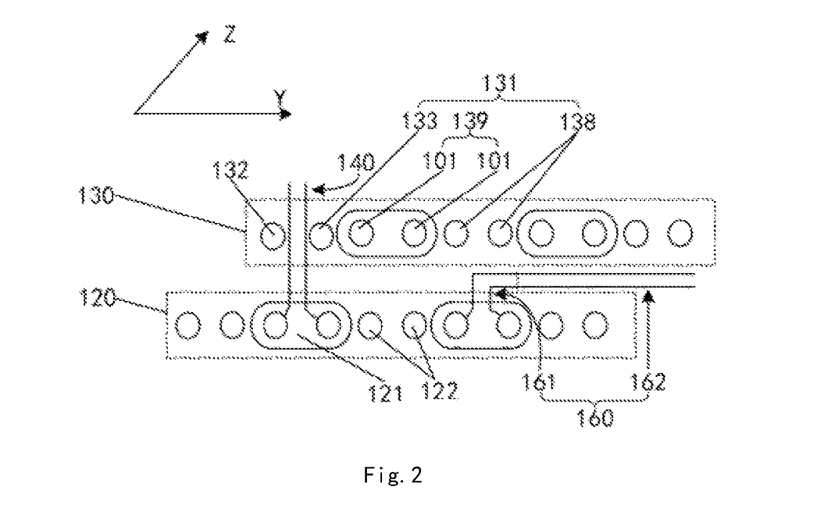
FIG. 2 is a schematic structural diagram provided in some embodiments of the present disclosure in which a packaging structure of a printed circuit board is located on a first outgoing line layer.
Figure 3:
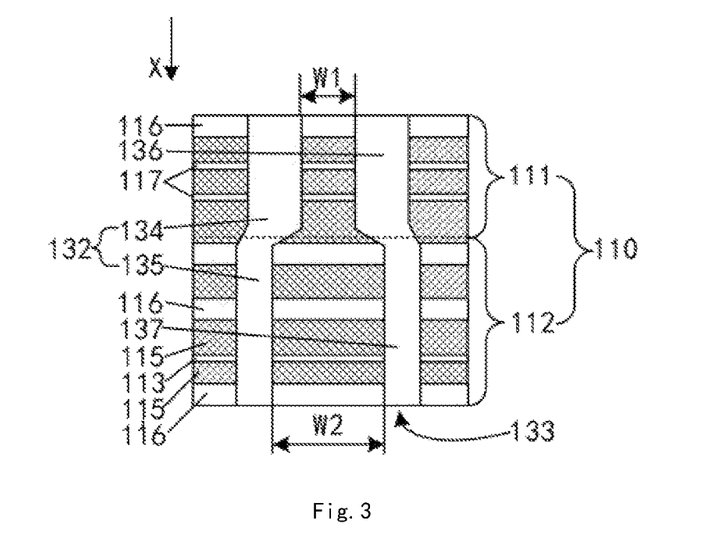
FIG. 3 is a partial sectional view of a board body of a printed circuit board provided in some embodiments of the present disclosure.

Referring to FIG. 2 and FIG. 3, a PCB (Printed Circuit Board) provided in some embodiments of the present disclosure includes a board body 110, a first column structural unit 120, a second column structural unit 130 and a first signal line 140; the board body 110 is provided with a first board block 111 and a second board block 112 in sequence in the thickness direction (an X direction shown in FIG. 3)

thereof, and the second board block 112 is provided with a first outgoing line layer 113; the first column structural unit 120 includes a plurality of first differential signal hole pairs 121 and a plurality of first ground holes 122, the plurality of first differential signal hole pairs 121 are sequentially disposed in a first direction (a Y direction shown in FIG. 2), and at least one first ground hole 122 is formed between two adjacent first differential signal hole pairs 121, wherein each first differential signal hole pair 121 and each first ground hole 122 both penetrate through the first board block 111 and the second board block 112, the first column structural unit 120 and the second column structural unit 130 are sequentially disposed in a second direction (a Z direction shown in FIG. 2), and the first direction intersects with the second direction; the second column structural unit 130 includes a plurality of via holes 131, the plurality of via holes 131 are sequentially formed in the first direction, the plurality of via holes 131 include a first via hole 132 and a second via hole 133 adjacent to the first via hole 132, wherein the first via hole 132 and the second via hole 133 both penetrate through the first board block 111 and the second board block 112, the first via hole 132 includes a first hole segment 134 and a second hole segment 135, the second via hole 133 includes a third hole segment 136 and a fourth hole segment 137, the first hole segment 134 and the third hole segment 136 are located in the first board block 111, the distance between the first hole segment 134 and the third hole segment 136 is a first distance W1, the second hole segment 135 and the fourth hole segment 137 are located in the second board block 112, the distance between the second hole segment 135 and the fourth hole segment 137 is a second distance W2, and the first distance W1 is less than the second distance W2; and the first signal line 140 is located on the first outgoing line layer 113, and the first signal line 140 extends, by means of passing through the second hole segment 135 and the fourth hole segment 137, from one first differential signal hole pair 121 of the first column structural unit 120 to the side of the second column structural unit 130 that is away from the first column structural unit 120.

In some embodiments, there are two first ground holes 122 between two adjacent first differential signal hole pairs 121, so that the distance between the two adjacent first differential signal hole pairs 121 can be increased, thereby reducing the signal crosstalk between the two adjacent first differential signal hole pairs 121. In addition, it should be noted that, the PCB provided in the present embodiment may be further provided with a third column structural unit, a fourth column structural unit or the like (not shown in the figures), the second column structural unit 130 and the third column structural unit may be sequentially disposed in the second direction and may also be sequentially disposed in a third direction (not shown in the figures), the third direction intersects with the second direction, and the third direction intersects with the first direction.

In some embodiments, the axis of the first hole segment 134 does not coincide with the axis of the second hole segment 135 and/or the diameter of the first hole segment 134 is greater than the diameter of the second hole segment 135.

Figure 4:
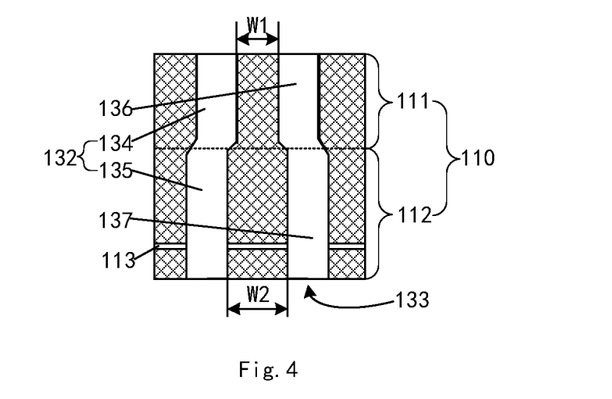
FIG. 4 is a partial sectional view of a board body of a printed circuit board provided in some embodiments of the present disclosure.

Referring to FIG. 4, in some embodiments, the diameter of the first hole segment 134 is the same as the diameter of the second hole segment 135, and the axis of the first hole segment 134 does not coincide with the axis of the second hole segment 135, so that the first distance W1 is less than the second distance W2. In some embodiments, the axis of the first hole segment 134 does not coincide with the axis of the second hole segment 135, and the axis of the second hole segment 135 is located on the side of the axis of the first hole segment 134 that is away from the axis of the fourth hole segment 137, so that the first distance W1 can be less than the second distance W2.

Figure 5:
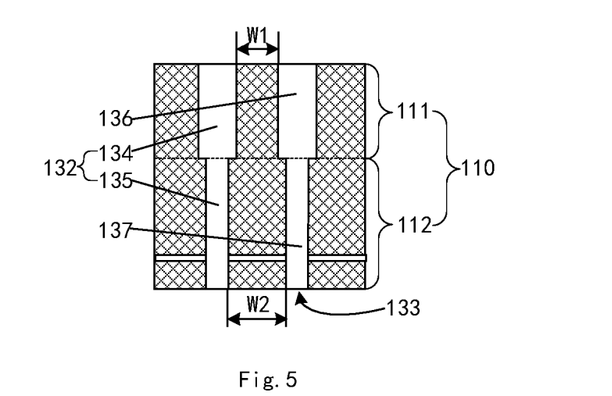
FIG. 5 is a partial sectional view of a board body of a printed circuit board provided in some embodiments of the present disclosure.

Referring to FIG. 5, in some other embodiments, the axis of the first hole segment 134 coincides with the axis of the second hole segment 135, and the diameter of the first hole segment 134 is greater than the diameter of the second hole segment 135. In this way, the distance between a side wall of the first hole segment 134 and a side wall of the third hole segment 136 may be greater than the distance between a side wall of the second hole segment 135 and a side wall of the fourth hole segment 137, so that the first distance W1 is less than the second distance W2.

With continued reference to FIG. 3, in some embodiments, the axis of the first hole segment 134 does not coincide with the axis of the second hole segment 135, and the diameter of the first hole segment 134 is greater than the diameter of the second hole segment 135. In this way, the second distance W2 can be further increased.

In some embodiments, the axis of the third hole segment 136 does not coincide with the axis of the fourth hole segment 137 and/or the diameter of the third hole segment 136 is greater than the diameter of the fourth hole segment 137.

With continued reference to FIG. 4, in some embodiments, the diameter of the third hole segment 136 is the same as the diameter of the fourth hole segment 137, and the axis of the third hole segment 136 does not coincide with the axis of the fourth hole segment 137, so that the first distance W1 is less than the second distance W2. In one embodiment, the axis of the third hole segment 136 does not coincide with the axis of the fourth hole segment 137, and the axis of the fourth hole segment 137 is located on the side of the axis of the third hole segment 136 that is away from the axis of the first hole segment 134, so that the first distance W1 can be less than the second distance W2.

With continued reference to FIG. 5, in some other embodiments, the axis of the third hole segment 136 coincides with the axis of the fourth hole segment 137, and the diameter of the third hole segment 136 is greater than the diameter of the fourth hole segment 137. In this way, the distance between the side wall of the third hole segment 136 and the side wall of the first hole segment 134 is less than the distance between the side wall of the fourth hole segment 137 and the side wall of the second hole segment 135, so that the first distance W1 is less than the second distance W2.

With continued reference to FIG. 3, in some embodiments, the axis of the third hole segment 136 does not coincide with the axis of the fourth hole segment 137, and the diameter of the third hole segment 136 is greater than the diameter of the fourth hole segment 137. In this way, since the axis of the first hole segment 134 does not coincide with the axis of the second hole segment 135, and the diameter of the first hole segment 134 is greater than the diameter of the second hole segment 135, the second distance W2 can be maximized.

In one embodiment, since the axis of the first hole segment 134 of the PCB does not coincide with the axis of the second hole segment 135, and the axis of the third hole segment 136 does not coincide with the axis of the fourth hole segment 137, when the first via hole 132 and the second via hole 133 of the PCB are manufactured, the side of the first board block 111 that is away from the second board block 112 may be firstly drilled to form the first hole segment 134 and the third hole segment 136, and then the side of the second board block 112 that is away from the first board block 111 is drilled to form the second hole segment 135 and the fourth hole segment 137.

In one embodiment, since the diameter of the first hole segment 134 of the PCB is greater than the diameter of the second hole segment 135, and the diameter of the third hole segment 136 is greater than the diameter of the fourth hole segment 137, when the first board block 111 is drilled to form the first hole segment 134 and the third hole segment 136, a large-diameter drill bit may be used; and when the second board block 112 is drilled to form the second hole segment 135 and the fourth hole segment 137, a small-diameter drill bit may be used. The large-diameter drill bit and the small-diameter drill bit are relatively speaking, that is, the diameter of the large-diameter drill bit is greater than the diameter of the small-diameter drill bit.

With continued reference to FIG. 2, in some embodiments, the plurality of via holes 131 of the second column structural unit 130 are a plurality of differential signal holes 101 and a plurality of second ground holes 138, the plurality of differential signal holes 101 are sequentially formed in the first direction, two adjacent differential signal holes 101 form a second differential signal hole pair 139, and at least one second ground hole 138 is formed between two adjacent second differential signal hole pairs 139.

In some embodiments, two adjacent second ground holes 138 are formed between two adjacent second differential signal hole pairs 139. Therefore, the distance between the two adjacent second differential signal hole pairs 139 in the second column structural unit 130 can be increased, and the signal crosstalk between the two adjacent second differential signal hole pairs 139 can thus be reduced. Similar to the two "second ground holes 138" formed between two adjacent second differential signal hole pairs 139, the first via hole 132 and the second via hole 133 are also "two ground holes" formed between two adjacent second differential signal hole pairs 139.

Figure 6:
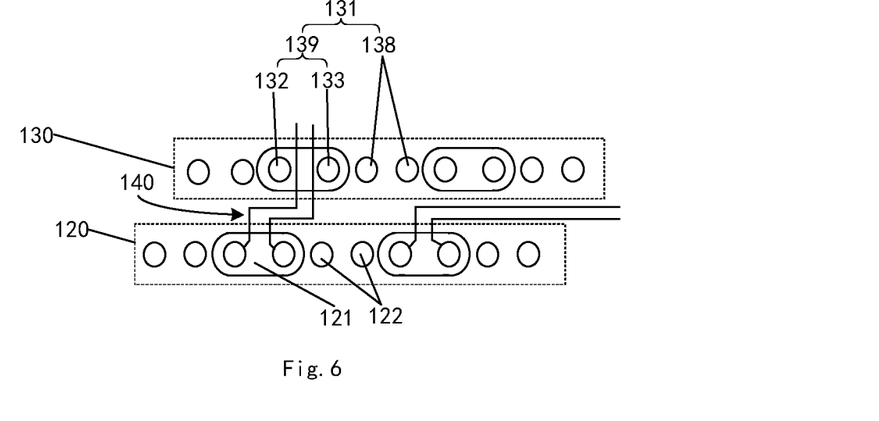
FIG. 6 is a schematic structural diagram provided in some embodiments of the present disclosure in which a packaging structure of a printed circuit board is located on a first outgoing line layer.
Figure 7:
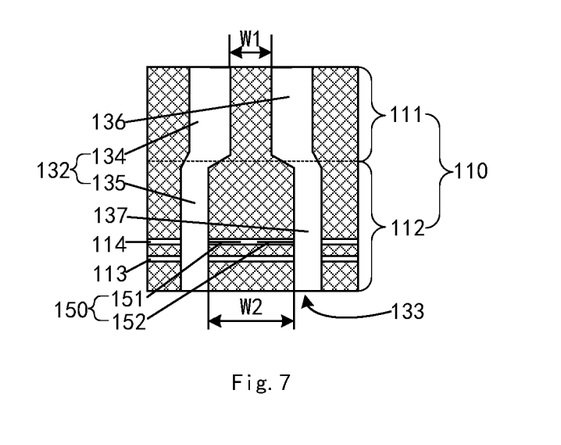
FIG. 7 is a partial sectional view of a board body of a printed circuit board provided in some embodiments of the present disclosure.

Referring to FIG. 6, in still some other embodiments, the first via hole 132 and the second via hole 133 are two differential signal holes of one second differential signal hole pair 139. Further, referring to FIG. 7 at the same time, in one embodiment, the PCB further includes: a second signal line 150; the board body 110 is further provided with a second outgoing line layer 114, and the second outgoing line layer 114 is located on the second board block 112; and the second signal line 150 is located on the second outgoing line layer 114, the second signal line 150 includes a first connecting line 151 and a second connecting line 152, and the first connecting line 151 and the second connecting line 152 are respectively connected with the first via hole 132 and the second via hole 133. Since the first signal line 140 is located on the first outgoing line layer 113, the first signal line 140 penetrates through the first via hole 132 and the second via hole 133, the second signal line 150, which is connected with the first via hole 132 and the second via hole 133, is located on the second outgoing line layer 114, that is, the outgoing line layer where the second signal line 150 is located is different from the outgoing line layer where the first signal line 140 is located, thereby avoiding the interference between the second signal line 150, which is connected with the first via hole 132 and the second via hole 133, and the first signal line 140. In addition, it should be noted that, in the present embodiment, the second outgoing line layer may also be located on the first board block.

Figure 8:
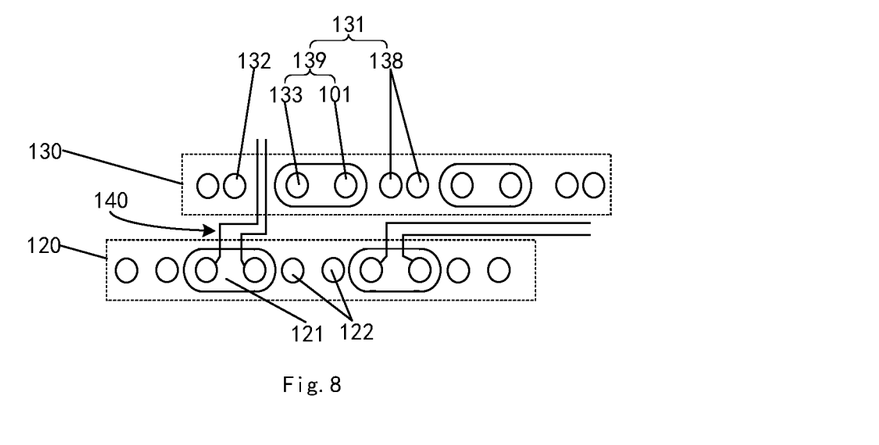
FIG. 8 is a schematic structural diagram provided in some embodiments of the present disclosure in which a packaging structure of a printed circuit board is located on a first outgoing line layer.

Referring to FIG. 8, in some other embodiments, the first via hole 132 is adjacent to the second via hole 133, and the first via hole 132 and the second via hole 133 are respectively one differential signal hole 101 and one second ground hole 138.

Further, with continued reference to FIG. 2 and FIG. 3, in some embodiments, the PCB further includes: a third signal line 160; the third signal line 160 is located on the first outgoing line layer 113, the third signal line 160 is located between the first column structural unit 120 and the second column structural unit 130, the third signal line 160 includes a bending portion 161 and an extension portion 162, the bending portion 161 extends to the extension portion 162, in a bending manner, from one first differential signal hole pair 121 of the first column structural unit 120 in a direction away from the first column structural unit 120 and close to the extension portion 162, and the extension portion 162 is located on the side of the bending portion 161 that is away from the first signal line 140 and extends in the first direction, so that the interference between the extension portion 162 and the first signal line 140 can be avoided; and in addition, the first differential signal hole pair 121 connected with the bending portion 161 is different from the first differential signal hole pair 121 connected with the first signal line 140.

In addition, in some embodiments, the first direction intersects with but is not perpendicular to the second direction, so that the first differential signal hole pair 121 in the first column structural unit 120 is staggered to the second differential signal hole pair 139 in the second column structural unit 130, thereby reducing the signal crosstalk between the first differential signal hole pair 121 in the first column structural unit 120 and the second differential signal hole pair 139 in the second column structural unit 130.

In addition, in some embodiments, the first differential signal hole pair 121 and the second differential signal hole pair 139 are through holes, and when the PCB provided in the present embodiment is produced and manufactured, the first differential signal hole pair 121 and the second differential signal hole pair 139 may be drilled on the second board block 112 to remove residual piles of the first differential signal hole pair 121 and the second differential signal hole pair 139, so as to reduce the influence of the residual piles of the first differential signal hole pair 121 and the second differential signal hole pair 139, and thus improving the signal transmission performance of the first differential signal hole pair 121 and the second differential signal hole pair 139.

In some embodiments, the first differential signal hole pair 121 and the second differential signal hole pair 139 are blind holes. In this way, there is no need to drill the first differential signal hole pair 121 and the second differential signal hole pair 139 on the second board block 112. In yet another embodiment, the first differential signal hole pair 121 and the second differential signal hole pair 139 are buried holes, and the buried hole includes an area in contact with a fish-eye contact of a high-speed connector.

With continued reference to FIG. 3, further, in some embodiments, the board body 110 is further provided with a plurality of dielectric layers 115, a plurality of conductive plane layers 116 and a plurality of third outgoing line layers 117, the conductive plane layers 116, the first outgoing line layer 113 and the plurality of third outgoing line layers 117 are all conductive layers, and the dielectric layers 115 are used for bonding two adjacent conductive layers and are used for insulating the two adjacent conductive layers. In the present embodiment, the numbers of the dielectric layers 115, the conductive planar layers 116 and the third outgoing line layers 117 of the board body are not limited, and the numbers of the dielectric layers 115, the conductive planar layers 116 and the third outgoing line layers 117 may vary according to the actual application requirements of the PCB.

Some embodiments of the present disclosure provide a signal transmission system, including: a PCB. The PCB provided in some embodiments of the present disclosure is the same as the PCB provided in some embodiments as described above, therefore the PCB included in the signal transmission system provided in some embodiments of the present disclosure also has the same technical effect as the PCB provided in some embodiments as described above, and thus details are not described herein again.

In some embodiments, the signal transmission system further includes: a connector, the connector includes a main body and a plurality of terminals, and the plurality of terminals are all fixed on the main body; and parts of a plurality of first differential signal hole pairs, a plurality of first ground holes and a plurality of via holes, which are located in a first board block, are respectively plugged with one of the plurality of terminals.

Some embodiments of the present disclosure provide another printed circuit board, a board body is provided with a first board block and a second board block in sequence in the thickness direction thereof, and the second board block is provided with a first outgoing line layer; a first column structural unit includes a plurality of first differential signal hole pairs and a plurality of first ground holes, the plurality of first differential signal hole pairs are sequentially disposed in a first direction, and at least one first ground hole is formed between two adjacent first differential signal hole pairs, wherein each first differential signal hole pair and each first ground hole both penetrate through the first board block and the second board block, the first column structural unit and the second column structural unit are sequentially disposed in a second direction, and the first direction intersects with the second direction; the second column structural unit includes a plurality of second differential signal hole pairs and a plurality of second ground holes, the plurality of second differential signal hole pairs are sequentially disposed in the first direction, and two adjacent second ground holes are formed between two adjacent second differential signal hole pairs, wherein each second differential signal hole pair and each second ground hole both penetrate through the first board block and the second board block; and a first signal line is located on the first outgoing line layer, and the first signal line extends, by means of passing through the two adjacent second ground holes, from one first differential signal hole pair of the first column structural unit to the side of the second column structural unit that is away from the first column structural unit.

In order to make the objectives, technical solutions and advantages of some embodiments of the present disclosure clearer, the other printed circuit board provided in some embodiments of the present disclosure will be described in detail below in combination with the drawings.

Figure 9:
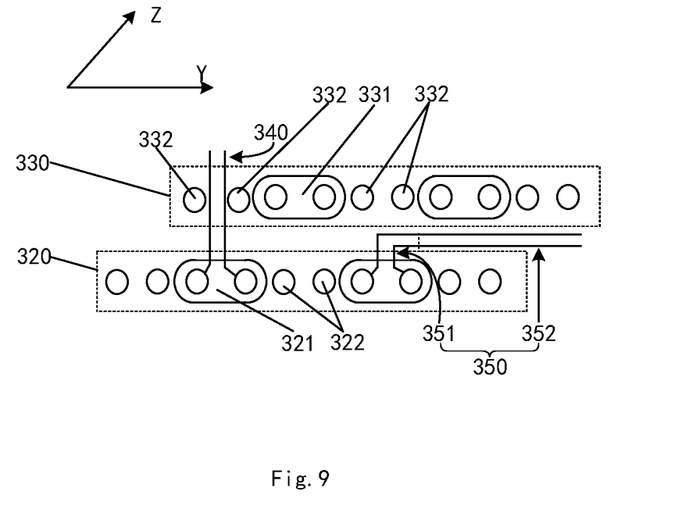
FIG. 9 is a schematic structural diagram provided in some embodiments of the present disclosure in which a packaging structure of another printed circuit board is located on a first outgoing line layer.
Figure 10:
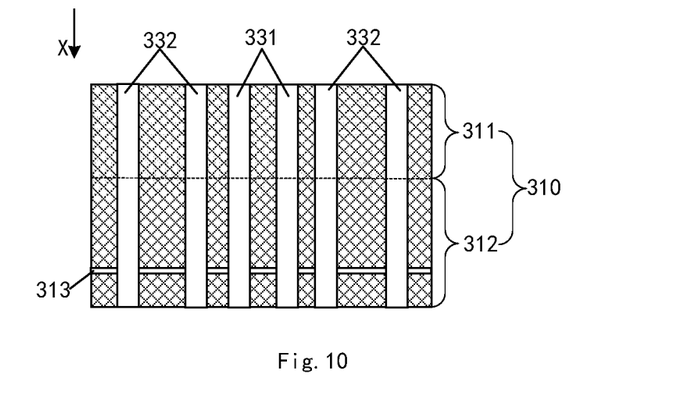
FIG. 10 is a partial sectional view of a board body of another printed circuit board provided in some embodiments of the present disclosure.

Referring to FIG. 9 and FIG. 10, a PCB provided in some embodiments of the present disclosure includes: a board body 310, a first column structural unit 320, a second column structural unit 330 and a first signal line 340; the board body 310 is provided with a first board block 311 and a second board block 312 in sequence in the thickness direction (an X direction shown in FIG. 10) thereof, and the second board block 312 is provided with a first outgoing line layer 313; the first column structural unit 320 includes a plurality of first differential signal hole pairs 321 and a plurality of first ground holes 322, the plurality of first differential signal hole pairs 321 are sequentially disposed in a first direction (a Y direction shown in FIG. 9), and at least one first ground hole 322 is formed between two adjacent first differential signal hole pairs 321, wherein each first differential signal hole pair 321 and each first ground hole 322 both penetrate through the first board block 311 and the second board block 312, the first column structural unit 320 and the second column structural unit 330 are sequentially disposed in a second direction (a Z direction shown in FIG. 9), and the first direction intersects with the second direction; the second column structural unit 330 includes a plurality of second differential signal hole pairs 331 and a plurality of second ground holes 332, the plurality of second differential signal hole pairs 331 are sequentially disposed in the first direction, and two adjacent second ground holes 332 are formed between two adjacent second differential signal hole pairs 331, wherein each second differential signal hole pair 331 and each second ground hole 332 both penetrate through the first board block 311 and the second board block 312; and the first signal line 340 is located on the first outgoing line layer 313, and the first signal line 340 extends, by means of passing through the two adjacent second ground holes 332, from one first differential signal hole pair 321 of the first column structural unit 320 to the side of the second column structural unit 330 that is away from the first column structural unit 320.

In some embodiments, there are two first ground holes 222 between two adjacent first differential signal hole pairs 321. In this way, the distance between the two adjacent first differential signal hole pairs 321 can be increased, thereby reducing the signal crosstalk between the two adjacent first differential signal hole pairs 321. In addition, it should be noted that the PCB provided in the present embodiment may be further provided with a third column structural unit, a fourth column structural unit or the like (not shown in the figures), the second column structural unit 330 and the third column structural unit may be sequentially disposed in the second direction and may also be sequentially disposed in a third direction (not shown in the figures), the third direction intersects with the second direction, and the third direction intersects with the first direction.

In some embodiments, the plurality of second ground holes 332 are sequentially formed in the first direction.

Further, in some embodiments, the PCB further includes a second signal line 350; the second signal line 350 is located on the first outgoing line layer 313, the second signal line 350 is located between the first column structural unit 320 and the second column structural unit 330, the second signal line 350 includes a bending portion 351 and an extension portion 352, the bending portion 351 extends to the extension portion 352, in a bending manner, from one first differential signal hole pair 321 of the first column structural unit 320 in a direction away from the first column structural unit 320 and close to the extension portion 352, and the extension portion 352 is located on the side of the bending portion 351 that is away from the first signal line 340 and extends in the first direction, and the first differential signal hole pair 321 connected with the bending portion 351 is different from the first differential signal hole pair 321 connected with the first signal line 340.

Some embodiments of the present disclosure provide a signal transmission system, including: a PCB. The PCB provided in some embodiments of the present disclosure is the same as the PCB provided in some embodiments as described above, therefore the PCB included in the signal transmission system provided in some embodiments of the present disclosure also has the same technical effect as the PCB provided in some embodiments as described above, and thus details are not described herein again.

In some embodiments, the signal transmission system further includes: a connector, the connector includes a main body and a plurality of terminals, and the plurality of terminals are all fixed on the main body; and parts of a plurality of first differential signal hole pairs, a plurality of first ground holes, a plurality of second differential signal hole pairs and a plurality of second ground holes, which are located in a first board block, are respectively plugged with one of the plurality of terminals.

What is claimed is:

1. A printed circuit board, comprising:
    a board body (110), a first column structural unit (120), a second column structural unit (130) and a first signal line (140);
    the board body (110) is provided with a first board block (111) and a second board block (112) in sequence in the thickness direction thereof, and the second board block (112) is provided with a first outgoing line layer (113);
    the first column structural unit (120) comprises a plurality of first differential signal hole pairs (121) and a plurality of first ground holes (122), the plurality of first differential signal hole pairs (121) are sequentially disposed in a first direction, and at least one first ground hole (122) is formed between two adjacent first differential signal hole pairs (121), wherein each first differential signal hole pair (121) and each first ground hole (122) both penetrate through the first board block (111) and the second board block (112), the first column structural unit (120) and the second column structural unit (130) are sequentially disposed in a second direction, and the first direction intersects with the second direction;
    the second column structural unit (130) comprises a plurality of via holes (131), the plurality of via holes (131) are sequentially formed in the first direction, the plurality of via holes (131) comprise a first via hole (132) and a second via hole (133) adjacent to the first via hole (132), wherein the first via hole (132) and the second via hole (133) both penetrate through the first board block (111) and the second board block (112), the first via hole (132) comprises a first hole segment (134) and a second hole segment (135), the second via hole (133) comprises a third hole segment (136) and a fourth hole segment (137), the first hole segment (134) and the third hole segment (136) are located in the first board block (111), the distance between the first hole segment (134) and the third hole segment (136) is a first distance, the second hole segment (135) and the fourth hole segment (137) are located in the second board block (112), the distance between the second hole segment (135) and the fourth hole segment (137) is a second distance, and the first distance is less than the second distance; and
    the first signal line (140) is located on the first outgoing line layer (113), and the first signal line (140) extends, by means of passing through the second hole segment (135) and the fourth hole segment (137), from one first differential signal hole pair (121) of the first column structural unit (120) to the side of the second column structural unit (130) that is away from the first column structural unit.

2. The printed circuit board according to claim 1, wherein the axis of the first hole segment (134) does not coincide with the axis of the second hole segment (135) and/or the diameter of the first hole segment (134) is greater than the diameter of the second hole segment (135).

3. The printed circuit board according to claim 2, wherein the axis of the third hole segment (136) does not coincide with the axis of the fourth hole segment (137) and/or the diameter of the third hole segment (136) is greater than the diameter of the fourth hole segment (137).

4. The printed circuit board according to claim 1, wherein the plurality of via holes (131) of the second column structural unit (130) are a plurality of differential signal holes (101) and a plurality of second ground holes (138), the plurality of differential signal holes 101 are sequentially formed in the first direction, two adjacent differential signal holes (101) form a second differential signal hole pair (139), and at least one second ground hole (138) is formed between two adjacent second differential signal hole pairs (139).

5. The printed circuit board according to claim 4, wherein the first via hole (132) and the second via hole (133) are two differential signal holes of one second differential signal hole pair (139).

6. The printed circuit board according to claim 5, further comprising: a second signal line (150);
    the board body (110) is further provided with a second outgoing line layer (114), and the second outgoing line layer (114) is located on the first board block (111) or the second board block 112; and
    the second signal line (150) is located on the second outgoing line layer (114), the second signal line (150) comprises a first connecting line (151) and a second connecting line (152), and the first connecting line (151) and the second connecting line (152) are respectively connected with the first via hole (132) and the second via hole (133).

7. The printed circuit board according to claim 4, wherein the first via hole (132) is adjacent to the second via hole (133), and the first via hole (132) and the second via hole (133) are one differential signal hole (101) and one second ground hole (138).

8. The printed circuit board according to claim 4, wherein the first via hole (132) and the second via hole (133) are two ground holes (138) formed between two adjacent second differential signal hole pairs (139).

9. The printed circuit board according to claim 1, further comprising: a third signal line (160);
    the third signal line (160) is located on the first outgoing line layer (113), the third signal line (160) is located between the first column structural unit (120) and the second column structural unit (130), the third signal line (160) comprises a bending portion (161) and an extension portion (162), the bending portion (161) extends to the extension portion (162), in a bending manner, from one first differential signal hole pair (121) of the first column structural unit (120) in a direction away from the first column structural unit (120) and close to the extension portion (162), and the extension portion (162) is located on the side of the bending portion (161) that is away from the first signal line (140) and extends in the first direction, and the first differential signal hole pair (121) connected with the bending portion (161) is different from the first differential signal hole pair (121) connected with the first signal line 140.

10. A signal transmission system, comprising the printed circuit board as claimed in claim 1.

11. The signal transmission system according to claim 10, further comprising:
    a connector;

the connector comprises a main body and a plurality of terminals, and the plurality of terminals are all fixed on the main body; and parts of the plurality of first differential signal hole pairs, the plurality of first ground holes and the plurality of via holes, which are located in the first board block, are respectively plugged with one of the plurality of terminals.

12. The signal transmission system according to claim 10, wherein the axis of the first hole segment (134) does not coincide with the axis of the second hole segment (135) and/or the diameter of the first hole segment (134) is greater than the diameter of the second hole segment (135).

13. The signal transmission system according to claim 12, wherein the axis of the third hole segment (136) does not coincide with the axis of the fourth hole segment (137) and/or the diameter of the third hole segment (136) is greater than the diameter of the fourth hole segment (137).

14. The signal transmission system according to claim 10, wherein the plurality of via holes (131) of the second column structural unit (130) are a plurality of differential signal holes (101) and a plurality of second ground holes (138), the plurality of differential signal holes 101 are sequentially formed in the first direction, two adjacent differential signal holes (101) form a second differential signal hole pair (139), and at least one second ground hole (138) is formed between two adjacent second differential signal hole pairs (139).

15. The signal transmission system according to claim 14, wherein the first via hole (132) and the second via hole (133) are two differential signal holes of one second differential signal hole pair (139).

16. A printed circuit board, comprising:
a board body (310), a first column structural unit (320), a second column structural unit (330) and a first signal line (340);
the board body (310) is provided with a first board block (311) and a second board block (312) in sequence in the thickness direction thereof, and the second board block (312) is provided with a first outgoing line layer (313);
the first column structural unit (320) comprises a plurality of first differential signal hole pairs (321) and a plurality of first ground holes (322), the plurality of first differential signal hole pairs (321) are sequentially disposed in a first direction, and at least one first ground hole (322) is formed between two adjacent first differential signal hole pairs (321), wherein each first differential signal hole pair (321) and each first ground hole (322) both penetrate through the first board block (311) and the second board block (312), the first column structural unit (320) and the second column structural unit (330) are sequentially disposed in a second direction, and the first direction intersects with the second direction;
the second column structural unit (330) comprises a plurality of second differential signal hole pairs (331) and a plurality of second ground holes (332), the plurality of second differential signal hole pairs (331) are sequentially disposed in the first direction, and two adjacent second ground holes (332) are formed between two adjacent second differential signal hole pairs (331), wherein each second differential signal hole pair (331) and each second ground hole (332) both penetrate through the first board block (311) and the second board block (312); and the first signal line (340) is located on the first outgoing line layer (313), and the first signal line (340) extends, by means of passing through the two adjacent second ground holes (332), from one first differential signal hole pair (321) of the first column structural unit (320) to the side of the second column structural unit (330) that is away from the first column structural unit (320).

17. The printed circuit board according to claim 16, further comprising: a second signal line (350);
the second signal line (350) is located on the first outgoing line layer (313), the second signal line (350) is located between the first column structural unit (320) and the second column structural unit (330), the second signal line (350) comprises a bending portion (351) and an extension portion (352), the bending portion (351) extends to the extension portion (352), in a bending manner, from one first differential signal hole pair (321) of the first column structural unit (320) in a direction away from the first column structural unit (320) and close to the extension portion (352), and the extension portion (352) is located on the side of the bending portion (351) that is away from the first signal line (340) and extends in the first direction, and the first differential signal hole pair (321) connected with the bending portion (351) is different from the first differential signal hole pair (321) connected with the first signal line (340).

18. A signal transmission system, comprising the printed circuit board as claimed in claim 16.

19. The signal transmission system according to claim 18, further comprising: a connector;
the connector comprises a main body and a plurality of terminals, and the plurality of terminals are all fixed on the main body; and
parts of the plurality of first differential signal hole pairs, the plurality of first ground holes, the plurality of second differential signal hole pairs and the plurality of second ground holes, which are located in the first board block, are respectively plugged with one of the plurality of terminal.

20. The signal transmission system according to claim 19, the printed circuit board further comprises a second signal line (350); wherein
the second signal line (350) is located on the first outgoing line layer (313), the second signal line (350) is located between the first column structural unit (320) and the second column structural unit (330), the second signal line (350) comprises a bending portion (351) and an extension portion (352), the bending portion (351) extends to the extension portion (352), in a bending manner, from one first differential signal hole pair (321) of the first column structural unit (320) in a direction away from the first column structural unit (320) and close to the extension portion (352), and the extension portion (352) is located on the side of the bending portion (351) that is away from the first signal line (340) and extends in the first direction, and the first differential signal hole pair (321) connected with the bending portion (351) is different from the first differential signal hole pair (321) connected with the first signal line (340).

* * * * *